United States Patent
Tseng et al.

(10) Patent No.: US 10,303,211 B2
(45) Date of Patent: May 28, 2019

(54) TWO PART CONE DISPLAY USING FLEXIBLE SUBSTRATES

(71) Applicant: Facebook Technologies, LLC, Menlo Park, CA (US)

(72) Inventors: Shie Ping Jeffrey Tseng, Los Altos, CA (US); Evan M. Richards, Santa Clara, CA (US); Shizhe Shen, San Mateo, CA (US); Jianru Shi, Union City, CA (US); Yue Shi, Santa Clara, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 137 days.

(21) Appl. No.: 15/422,334

(22) Filed: Feb. 1, 2017

(65) Prior Publication Data

US 2018/0217632 A1 Aug. 2, 2018

(51) Int. Cl.
*G06F 1/16* (2006.01)
*G02B 27/22* (2018.01)
*H01L 51/00* (2006.01)
*H01L 27/32* (2006.01)

(52) U.S. Cl.
CPC .......... *G06F 1/163* (2013.01); *G02B 27/2271* (2013.01); *G06F 1/1637* (2013.01); *G06F 1/1652* (2013.01); *H01L 27/3293* (2013.01); *H01L 51/0097* (2013.01); *H01L 27/3244* (2013.01); *H01L 2251/5338* (2013.01)

(58) Field of Classification Search
CPC .............................. G06F 1/163; H01L 51/0097
See application file for complete search history.

(56) References Cited

U.S. PATENT DOCUMENTS

| 4,794,024 | A | * | 12/1988 | Crowell | G09F 1/06 40/124.08 |
|---|---|---|---|---|---|
| 5,572,343 | A | * | 11/1996 | Okamura | G02B 27/017 345/8 |
| 5,797,815 | A | * | 8/1998 | Goldman | A63H 33/18 446/46 |
| 6,221,457 | B1 | * | 4/2001 | Rasmussen | G09B 27/08 40/615 |
| 7,511,311 | B2 | * | 3/2009 | Kususe | H01L 24/06 257/94 |
| 7,546,702 | B2 | * | 6/2009 | Malkovas | G09F 1/08 40/124.08 |

(Continued)

*Primary Examiner* — Nitin Patel
*Assistant Examiner* — Robert M Stone
(74) *Attorney, Agent, or Firm* — Fenwick & West LLP

(57) ABSTRACT

An organic light emitting diode (OLED) display including a conic OLED panel portion and a base OLED panel portion. The conic OLED panel portion includes peripheral display surfaces forming a truncated conic shape with an open base region around a center of the conic OLED panel portion. The OLED base portion includes a display surface. The base OLED panel portion is positioned to cover the open base region of the conic OLED panel portion such that the peripheral display surfaces surround the base display surface. The OLED display approximates a circular convex display. The conic OLED panel portion may be fabricated from a flat, flexible OLED panel portion that is bent along the fold regions defining bending axes between the peripheral display surfaces to form the truncated conic shape.

20 Claims, 9 Drawing Sheets

(56) References Cited

U.S. PATENT DOCUMENTS

| | | | | |
|---|---|---|---|---|
| 7,789,531 B2* | 9/2010 | Duong | H01L 33/20 | 362/257 |
| 8,582,209 B1* | 11/2013 | Amirparviz | G02B 3/0056 | 359/630 |
| 9,759,420 B1* | 9/2017 | Baloga | F21V 33/0012 | |
| 2002/0075452 A1* | 6/2002 | Kessler | G02B 27/225 | 353/7 |
| 2002/0181115 A1* | 12/2002 | Massof | G02B 27/017 | 359/630 |
| 2002/0196554 A1* | 12/2002 | Cobb | G02B 27/0172 | 359/633 |
| 2003/0020399 A1* | 1/2003 | Moller | G02B 3/0031 | 313/504 |
| 2004/0160166 A1* | 8/2004 | Cok | F21S 6/002 | 313/498 |
| 2004/0212882 A1* | 10/2004 | Liang | G02B 27/2235 | 359/462 |
| 2004/0227703 A1* | 11/2004 | Lamvik | G02B 27/0172 | 345/76 |
| 2004/0246250 A1* | 12/2004 | Kaku | G06T 15/04 | 345/419 |
| 2005/0110702 A1* | 5/2005 | Aoki | G06F 1/1601 | 345/30 |
| 2006/0107575 A1* | 5/2006 | Ashley | G09F 15/0062 | 40/612 |
| 2008/0080166 A1* | 4/2008 | Duong | H01L 33/20 | 362/84 |
| 2009/0275366 A1* | 11/2009 | Schilling | G06F 1/1615 | 455/566 |
| 2010/0046210 A1* | 2/2010 | Mathai | H01L 51/52 | 362/147 |
| 2012/0038570 A1* | 2/2012 | Delaporte | G06F 1/1616 | 345/173 |
| 2012/0106169 A1* | 5/2012 | Kim | G02B 3/0056 | 362/311.02 |
| 2012/0262929 A1* | 10/2012 | Knapp | H01L 51/5203 | 362/382 |
| 2012/0306910 A1* | 12/2012 | Kim | H04N 13/04 | 345/619 |
| 2013/0285921 A1* | 10/2013 | Alberth, Jr. | G06F 1/1652 | 345/173 |
| 2013/0285922 A1* | 10/2013 | Alberth, Jr. | G06F 1/1694 | 345/173 |
| 2014/0002419 A1* | 1/2014 | Thorson | G06F 3/147 | 345/175 |
| 2014/0056028 A1* | 2/2014 | Nichol | G02B 6/0028 | 362/611 |
| 2014/0266990 A1* | 9/2014 | Makino | G02B 27/017 | 345/8 |
| 2014/0340856 A1* | 11/2014 | Yeo | H05K 1/0281 | 361/749 |
| 2014/0361251 A1* | 12/2014 | Krall | H01L 51/52 | 257/40 |
| 2015/0205126 A1* | 7/2015 | Schowengerdt | G06T 13/40 | 345/633 |
| 2015/0235426 A1* | 8/2015 | Lyons | G02B 27/0172 | 345/8 |
| 2015/0312560 A1* | 10/2015 | Deering | G02B 13/0085 | 345/1.3 |
| 2015/0365658 A1* | 12/2015 | Devale | G06F 3/013 | 348/51 |
| 2016/0210103 A1* | 7/2016 | Yoshizumi | G06F 3/1446 | |
| 2016/0210782 A1* | 7/2016 | Thomas | G06T 19/006 | |
| 2016/0277727 A1* | 9/2016 | Brown | H04N 13/307 | |
| 2016/0320559 A1* | 11/2016 | Richards | G02B 6/06 | |
| 2016/0341953 A1* | 11/2016 | Tseng | G02B 27/0176 | |
| 2017/0171533 A1* | 6/2017 | Benitez | H04N 13/383 | |
| 2017/0205060 A1* | 7/2017 | Kennedy | F21S 6/002 | |
| 2017/0249874 A1* | 8/2017 | Lopez Fern ndez | G09F 1/065 | |
| 2017/0270835 A1* | 9/2017 | Yang | G09F 9/30 | |
| 2017/0357100 A1* | 12/2017 | Ouderkirk | G02B 27/281 | |

* cited by examiner

700

Fabricate a organic light emitting diode (OLED) panel portion having peripheral display surfaces separated by bending regions
710

Bend the OLED panel portion along the bending regions to form a conic OLED panel portion
720

Fabricate a base OLED panel portion
730

Position the base OLED panel portion to cover the open base region of the conic OLED panel portion
740

FIG. 7

TWO PART CONE DISPLAY USING FLEXIBLE SUBSTRATES

BACKGROUND

Head-mounted displays (HMDs) may include an optics block, including one or more optical elements, positioned between an electronic display and the user's eye. The optics block can provide for adjustable focal lengths between the user's eye and the electronic display. When a flat electronic display is used, the optics block can bend light outwards from a straight image plane of the electronic display. This can result in the distortion of images presented to the user, especially at the peripheral regions of the flat electronic display after light from the electronic display is passed through the optics block.

SUMMARY

An organic light emitting diode (OLED) display including a conic OLED panel portion and a base OLED panel portion. The OLED display approximates a circular convex display to compensate for light distortion at peripheral display regions caused by optics blocks in HMDs, and is also referred to herein as a "two part cone OLED display." The conic OLED panel portion includes peripheral display surfaces forming a truncated conic shape with an open base region around a center of the conic OLED panel portion. The OLED base portion includes a base display surface. The base OLED panel portion is positioned to cover the open base region of the conic OLED panel portion such that the peripheral display surfaces surround the base display surface. The conic OLED panel portion may be fabricated from a flat, flexible OLED panel portion that is bent along the fold regions defining bending axes between the peripheral display surfaces to form the truncated conic shape.

Some embodiments may include method of manufacturing an organic light emitting diode (OLED) display. The method may include: fabricating an OLED panel portion having peripheral display surfaces separated by bending regions; bending the OLED panel portion along the bending regions to form a conic OLED panel portion, the peripheral display surfaces of the conic OLED panel portion forming a truncated conic shape with an open base region around a center of the conic OLED panel portion; fabricating a base OLED panel portion having a base display surface; and positioning the base OLED panel portion to cover the open base region of the conic OLED panel portion such that the peripheral display surfaces surround the base display surface.

Some embodiments may include a head-mounted display (HMD) including a left two part cone OLED display and a right two part cone OLED display. Each two part cone OLED display includes a conic OLED panel portion and a base OLED panel portion. A left optics block is positioned in front of the left two part cone OLED display to direct light emitted from the left two part cone OLED display, and a right optics block is positioned in front of the right two part cone OLED display to direct light emitted from the right two part cone OLED display. Because of the shape of each two part cone display, light emitted from the peripheral display surfaces and base display surface generates a substantially flat image for the user after the light passes through the optics block.

BRIEF DESCRIPTION OF THE DRAWINGS

FIG. 7 shows a method of manufacturing a two part cone display, in accordance with some embodiments.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Configuration Overview

OLED displays with flat display surfaces that are bent to approximate circular convex displays are discussed herein. The flat display surfaces include a base display region, and multiple peripheral display regions surround the base display region. The peripheral display regions are arranged at an angle relative to the base display region such that the OLED display approximates a circular convex shape. When the OLED display is mounted in a HMD with an optics block, the peripheral display regions compensate for light distortion by an optics block in the HMD to provide a substantially flat image to the user's eye.

System Overview

Figure 1:
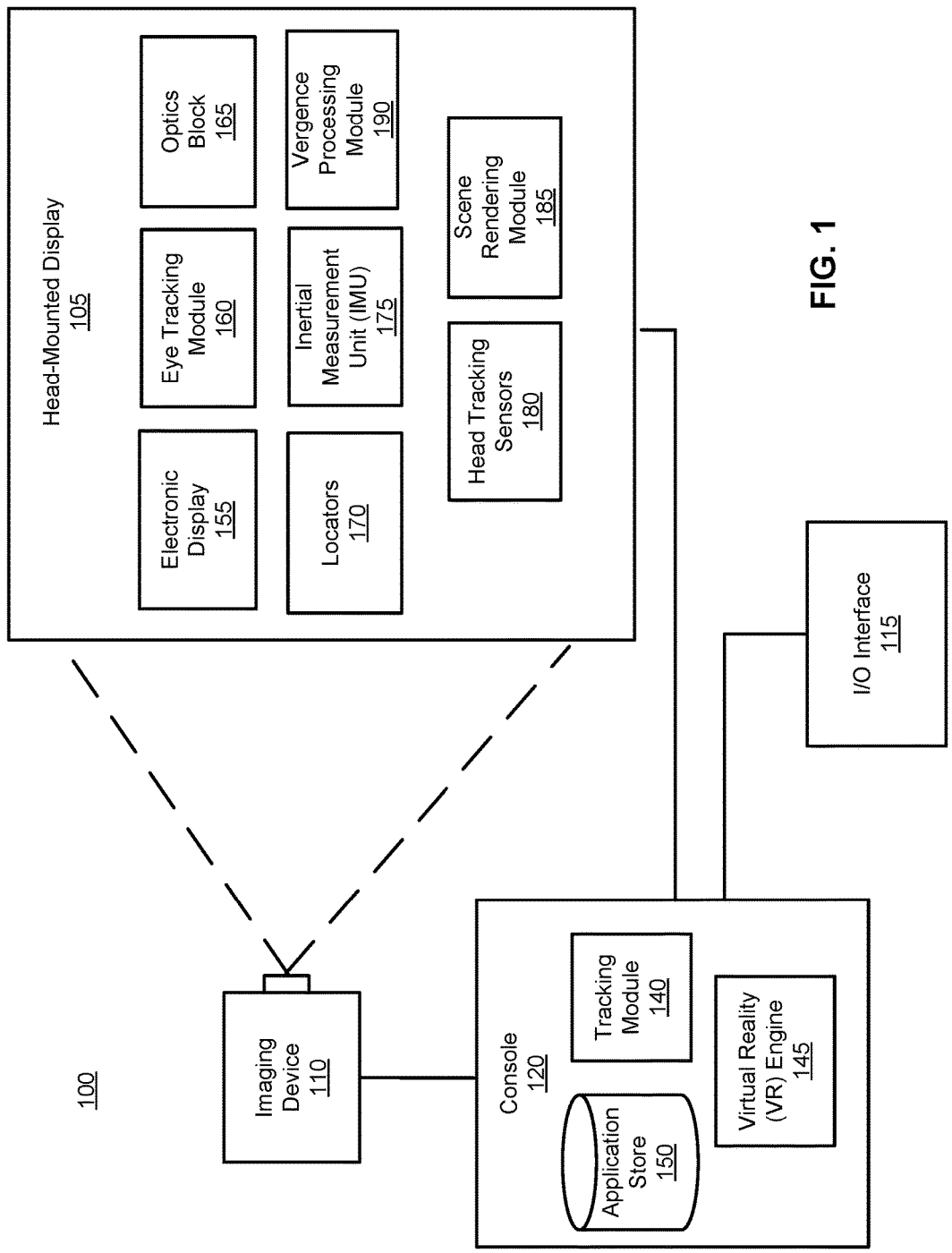
FIG. 1 shows a system, in accordance with some embodiments.

FIG. 1 shows a system 100 including a head-mounted display (HMD). The system 100 may be for use as a virtual reality (VR) system, an augmented reality (AR) system, a mixed reality (MR) system, or some combination thereof. In this example, the system 100 includes a HMD 105, an imaging device 110, and an input/output (I/O) interface 115, which are each coupled to a console 120. While FIG. 1 shows a single HMD 105, a single imaging device 110, and an I/O interface 115, in other embodiments, any number of these components may be included in the system. For example, there may be multiple HMDs 105 each having an associated input interface 115 and being monitored by one or more imaging devices 110, with each HMD 105, I/O interface 115, and imaging devices 110 communicating with the console 120. In alternative configurations, different and/or additional components may also be included in the system 100. The HMD 105 may act as a VR, AR, and/or a MR HMD. An MR and/or AR HMD augments views of a physical, real-world environment with computer-generated elements (e.g., images, video, sound, etc.).

The HMD 105 presents content to a user. Example content includes images, video, audio, or some combination thereof. Audio content may be presented via a separate device (e.g., speakers and/or headphones) external to the HMD 105 that receives audio information from the HMD 105, the console 120, or both. The HMD 105 includes an electronic display 155, an eye tracking module 160, an optics block 165, one or more locators 170, an internal measurement unit (IMU) 175, head tracking sensors 180, and a scene rendering module 185, and a vergence processing module 190.

The electronic display 155 includes an OLED display. As discussed in greater detail below, the OLED display may be a two part cone display including a conic OLED panel portion and a base OLED panel portion. The conic OLED panel portion includes peripheral display surfaces that form a truncated conic shape with an open base region around a center of the conic OLED panel portion. The base OLED portion is positioned to cover the open base region of the conic OLED panel portion such that the peripheral display surfaces surround the base display surface.

The optics block 165 adjusts its focal length responsive to instructions from the console 120. In some embodiments, the optics block 165 includes a multi multifocal block to adjust a focal length (adjusts optical power) of the optics block 165.

The eye tracking module 160 tracks an eye position and eye movement of a user of the HMD 105. A camera or other optical sensor inside the HMD 105 captures image information of a user's eyes, and the eye tracking module 160 uses the captured information to determine interpupillary distance, interocular distance, a three-dimensional (3D) position of each eye relative to the HMD 105 (e.g., for distortion adjustment purposes), including a magnitude of torsion and rotation (i.e., roll, pitch, and yaw) and gaze directions for each eye. The information for the position and orientation of the user's eyes is used to determine the gaze point in a virtual scene presented by the HMD 105 where the user is looking.

The vergence processing module 190 determines a vergence depth of a user's gaze based on the gaze point or an estimated intersection of the gaze lines determined by the eye tracking module 160. Vergence is the simultaneous movement or rotation of both eyes in opposite directions to maintain single binocular vision, which is naturally and automatically performed by the human eye. Thus, a location where a user's eyes are verged is where the user is looking and is also typically the location where the user's eyes are focused. For example, the vergence processing module 190 triangulates the gaze lines to estimate a distance or depth from the user associated with intersection of the gaze lines. The depth associated with intersection of the gaze lines can then be used as an approximation for the accommodation distance, which identifies a distance from the user where the user's eyes are directed. Thus, the vergence distance allows determination of a location where the user's eyes should be focused.

The locators 170 are objects located in specific positions on the HMD 105 relative to one another and relative to a specific reference point on the HMD 105. A locator 170 may be a light emitting diode (LED), a corner cube reflector, a reflective marker, a type of light source that contrasts with an environment in which the HMD 805 operates, or some combination thereof. Active locators 170 (i.e., an LED or other type of light emitting device) may emit light in the visible band (~380 nm to 850 nm), in the infrared (IR) band (~850 nm to 1 mm), in the ultraviolet band (10 nm to 380 nm), some other portion of the electromagnetic spectrum, or some combination thereof.

The locators 170 can be located beneath an outer surface of the HMD 105, which is transparent to the wavelengths of light emitted or reflected by the locators 170 or is thin enough not to substantially attenuate the wavelengths of light emitted or reflected by the locators 170. Further, the outer surface or other portions of the HMD 105 can be opaque in the visible band of wavelengths of light. Thus, the locators 170 may emit light in the IR band while under an outer surface of the HMD 105 that is transparent in the IR band but opaque in the visible band.

The IMU 175 is an electronic device that generates fast calibration data based on measurement signals received from one or more of the head tracking sensors 180, which generate one or more measurement signals in response to motion of HMD 105. Examples of the head tracking sensors 180 include accelerometers, gyroscopes, magnetometers, other sensors suitable for detecting motion, correcting error associated with the IMU 175, or some combination thereof. The head tracking sensors 180 may be located external to the IMU 175, internal to the IMU 175, or some combination thereof.

Based on the measurement signals from the head tracking sensors 180, the IMU 175 generates fast calibration data indicating an estimated position of the HMD 105 relative to an initial position of the HMD 105. For example, the head tracking sensors 180 include multiple accelerometers to measure translational motion (forward/back, up/down, left/right) and multiple gyroscopes to measure rotational motion (e.g., pitch, yaw, and roll). The IMU 175 can, for example, rapidly sample the measurement signals and calculate the estimated position of the HMD 105 from the sampled data. For example, the IMU 175 integrates measurement signals received from the accelerometers over time to estimate a velocity vector and integrates the velocity vector over time to determine an estimated position of a reference point on the HMD 105. The reference point is a point that may be used to describe the position of the HMD 105. While the reference point may generally be defined as a point in space, in various embodiments, a reference point is defined as a point within the HMD 105 (e.g., a center of the IMU 175). Alternatively, the IMU 175 provides the sampled measurement signals to the console 120, which determines the fast calibration data.

The IMU 175 can additionally receive one or more calibration parameters from the console 120. As further discussed below, the one or more calibration parameters are used to maintain tracking of the HMD 105. Based on a received calibration parameter, the IMU 175 may adjust one or more of the IMU parameters (e.g., sample rate). In some embodiments, certain calibration parameters cause the IMU 175 to update an initial position of the reference point to correspond to a next calibrated position of the reference point. Updating the initial position of the reference point as the next calibrated position of the reference point helps reduce accumulated error associated with determining the estimated position. The accumulated error, also referred to as drift error, causes the estimated position of the reference point to "drift" away from the actual position of the reference point over time.

The scene rendering module 185 receives content for the virtual scene from a VR engine 145 and provides the content for display on the electronic display 155. Additionally, the scene rendering module 185 can adjust the content based on information from the IMU 175, the vergence processing module 830, and the head tracking sensors 180. The scene rendering module 185 determines a portion of the content to be displayed on the electronic display 155 based on one or more of the tracking module 140, the head tracking sensors 180, or the IMU 175.

The imaging device 110 generates slow calibration data in accordance with calibration parameters received from the console 120. Slow calibration data includes one or more images showing observed positions of the locators 125 that are detectable by imaging device 110. The imaging device 110 may include one or more cameras, one or more video cameras, other devices capable of capturing images including one or more locators 170, or some combination thereof. Additionally, the imaging device 110 may include one or more filters (e.g., for increasing signal to noise ratio). The imaging device 110 is configured to detect light emitted or reflected from the locators 170 in a field of view of the imaging device 110. In embodiments where the locators 170 include passive elements (e.g., a retroreflector), the imaging device 110 may include a light source that illuminates some or all of the locators 170, which retro-reflect the light towards the light source in the imaging device 110. Slow calibration data is communicated from the imaging device 110 to the console 120, and the imaging device 110 receives one or more calibration parameters from the console 120 to adjust one or more imaging parameters (e.g., focal length, focus, frame rate, ISO, sensor temperature, shutter speed, aperture, etc.).

The I/O interface 115 is a device that allows a user to send action requests to the console 120. An action request is a request to perform a particular action. For example, an action request may be to start or end an application or to perform a particular action within the application. The I/O interface 115 may include one or more input devices. Example input devices include a keyboard, a mouse, a hand-held controller, a glove controller, or any other suitable device for receiving action requests and communicating the received action requests to the console 120. An action request received by the I/O interface 115 is communicated to the console 120, which performs an action corresponding to the action request. In some embodiments, the I/O interface 115 may provide haptic feedback to the user in accordance with instructions received from the console 120. For example, haptic feedback is provided by the I/O interface 115 when an action request is received, or the console 120 communicates instructions to the I/O interface 115 causing the I/O interface 115 to generate haptic feedback when the console 120 performs an action.

The console 120 provides content to the HMD 105 for presentation to the user in accordance with information received from the imaging device 110, the HMD 105, or the I/O interface 115. The console 120 includes an application store 150, a tracking module 140, and the VR engine 145. Some embodiments of the console 120 have different or additional modules than those described in conjunction with FIG. 1. Similarly, the functions further described below may be distributed among components of the console 120 in a different manner than is described here.

The application store 150 stores one or more applications for execution by the console 120. An application is a group of instructions, that when executed by a processor, generates content for presentation to the user. Content generated by an application may be in response to inputs received from the user via movement of the HMD 105 or the I/O interface 115. Examples of applications include gaming applications, conferencing applications, video playback application, or other suitable applications.

The tracking module 140 calibrates the system 100 using one or more calibration parameters and may adjust one or more calibration parameters to reduce error in determining position of the HMD 105. For example, the tracking module 140 adjusts the focus of the imaging device 110 to obtain a more accurate position for observed locators 170 on the HMD 105. Moreover, calibration performed by the tracking module 140 also accounts for information received from the IMU 175. Additionally, if tracking of the HMD 105 is lost (e.g., imaging device 110 loses line of sight of at least a threshold number of locators 170), the tracking module 140 re-calibrates some or all of the system 100 components.

Additionally, the tracking module 140 tracks the movement of the HMD 105 using slow calibration information from the imaging device 110 and determines positions of a reference point on the HMD 105 using observed locators from the slow calibration information and a model of the HMD 105. The tracking module 140 also determines positions of the reference point on the HMD 105 using position information from the fast calibration information from the IMU 175 on the HMD 105. Additionally, the tracking module 160 may use portions of the fast calibration information, the slow calibration information, or some combination thereof, to predict a future location of the HMD 105, which is provided to the VR engine 145.

The VR engine 145 executes applications within the system 100 and receives position information, acceleration information, velocity information, predicted future positions, or some combination thereof for the HMD 105 from the tracking module 140. Based on the received information, the VR engine 145 determines content to provide to the HMD 105 for presentation to the user, such as a virtual scene, one or more virtual objects to overlay onto a real world scene, etc.

In some embodiments, the VR engine 145 maintains focal capability information of the optics block 165. Focal capability information is information that describes what focal distances are available to the optics block 165. Focal capability information may include, e.g., a range of focus the optics block 165 is able to accommodate (e.g., 0 to 4 diopters), a resolution of focus (e.g., 0.25 diopters), a number of focal planes, combinations of settings for switchable half wave plates (SHWPs) (e.g., active or non-active) that map to particular focal planes, combinations of settings for SHWPS and active liquid crystal lenses that map to particular focal planes, or some combination thereof.

The VR engine 145 generates instructions for the optics block 165, the instructions causing the optics block 165 to adjust its focal distance to a particular location. The VR engine 145 generates the instructions based on focal capability information and, e.g., information from the vergence processing module 190, the IMU 175, and the head tracking sensors 180. The VR engine 145 uses the information from the vergence processing module 190, the IMU 175, and the head tracking sensors 180, or some combination thereof, to select an ideal focal plane to present content to the user. The VR engine 145 then uses the focal capability information to select a focal plane that is closest to the ideal focal plane. The VR engine 145 uses the focal information to determine settings for one or more SHWPs, one or more active liquid crystal lenses, or some combination thereof, within the optics block 176 that are associated with the selected focal plane. The VR engine 145 generates instructions based on the determined settings, and provides the instructions to the optics block 165.

The VR engine 145 performs an action within an application executing on the console 120 in response to an action request received from the I/O interface 115 and provides feedback to the user that the action was performed. The provided feedback may be visual or audible feedback via the HMD 105 or haptic feedback via the I/O interface 115.

Figure 2:
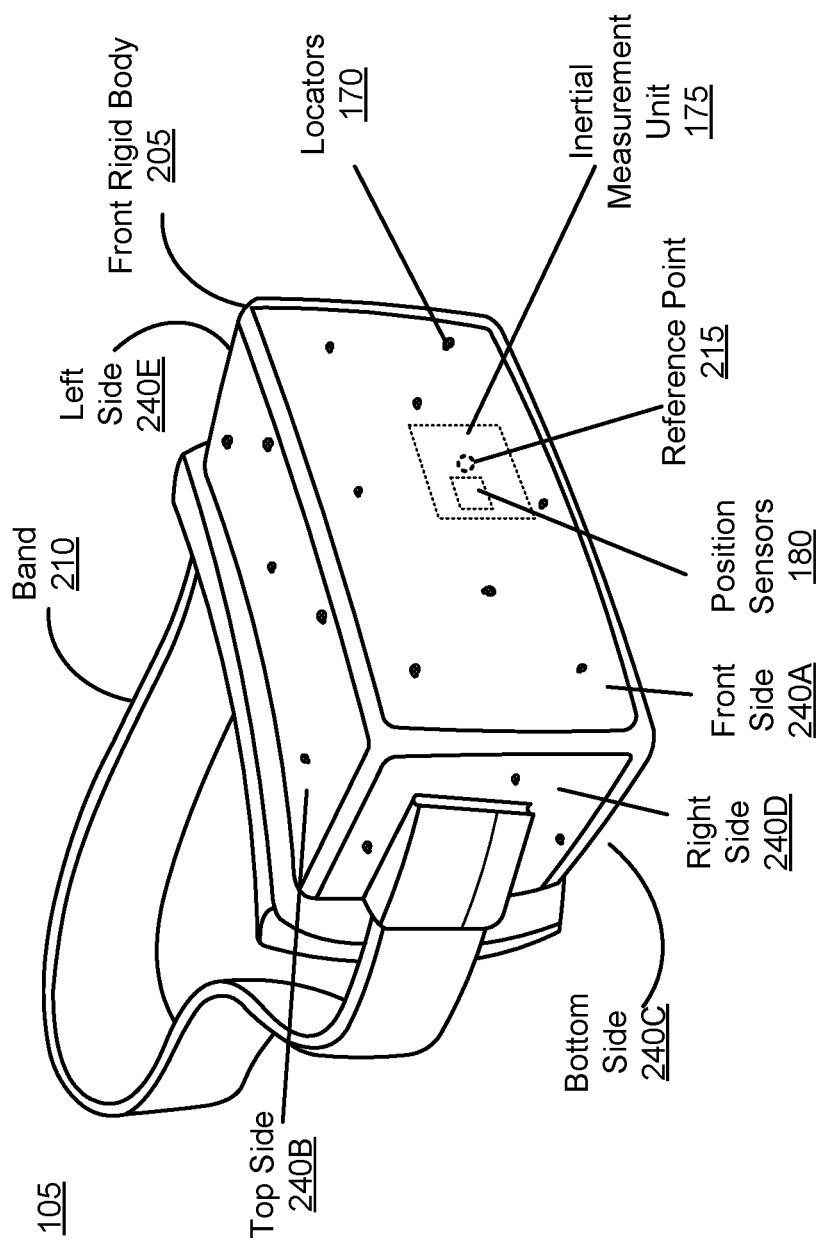
FIG. 2 shows a head-mounted display (HMD), in accordance with some embodiments.

FIG. 2 shows a head-mounted display (HMD) 105, in accordance with some embodiments. The HMD 105 includes a front rigid body 205 and a band 210. The front rigid body 205 includes an electronic display (not shown), an inertial measurement unit (IMU) 175, one or more position sensors 180, and locators 170. In some embodiments, a user movement is detected by use of the inertial measurement unit 175, position sensors 180, and/or the locators 170, and an image is presented to a user through the electronic display according to the user movement detected. In some embodiments, the HMD 105 can be used for presenting a virtual reality, an augmented reality, or a mixed reality to a user.

A position sensor 180 generates one or more measurement signals in response to motion of the HMD 105. Examples of position sensors 180 include: one or more accelerometers, one or more gyroscopes, one or more magnetometers, another suitable type of sensor that detects motion, a type of sensor used for error correction of the IMU 175, or some combination thereof. The position sensors 180 may be located external to the IMU 175, internal to the IMU 175, or some combination thereof. In FIG. 2, the position sensors 180 are located within the IMU 175, and neither the IMU 175 nor the position sensors 180 are visible to the user.

Based on the one or more measurement signals from one or more position sensors 180, the IMU 175 generates calibration data indicating an estimated position of the HMD 105 relative to an initial position of the HMD 105. In some embodiments, the IMU 175 rapidly samples the measurement signals and calculates the estimated position of the HMD 100 from the sampled data. For example, the IMU 175 integrates the measurement signals received from the accelerometers over time to estimate a velocity vector and integrates the velocity vector over time to determine an estimated position of a reference point on the HMD 105. Alternatively, the IMU 17 provides the sampled measurement signals to a console (e.g., a computer), which determines the calibration data. The reference point is a point that may be used to describe the position of the HMD 105. While the reference point may generally be defined as a point in space; however, in practice the reference point is defined as a point within the HMD 105 (e.g., a center of the IMU 175).

The locators 180 are located in fixed positions on the front rigid body 205 relative to one another and relative to a reference point 215. In FIG. 2, the reference point 215 is located at the center of the IMU 175. Each of the locators 170 emits light that is detectable by an imaging device (e.g., camera or an image sensor). Locators 170, or portions of locators 170, are located on a front side 240A, a top side 240B, a bottom side 240C, a right side 240D, and a left side 240E of the front rigid body 205 in the example of FIG. 2.

Figure 3:
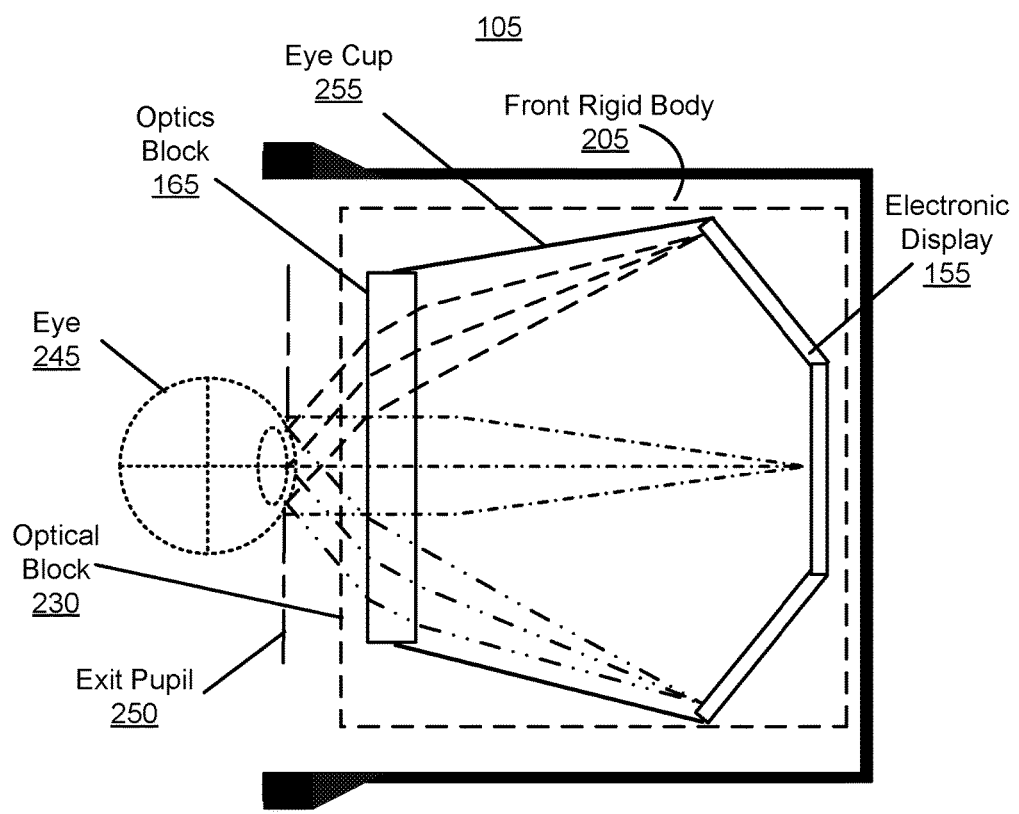
FIG. 3 shows a cross section of a front rigid body of the HMD in FIG. 2, in accordance with some embodiments.

FIG. 3 shows a cross section of the front rigid body 205 of the HMD 105 shown in FIG. 2. The front rigid body 205 includes an optical block 230 that provides altered image light to an exit pupil 250. The exit pupil 250 is the location in the front rigid body 205 where a user's eye 245 is positioned. For purposes of illustration, FIG. 3 shows a cross section associated with a single eye 245, but the HMD 105 may include another optical block that provides altered image light to another eye of the user.

The optical block 230 includes the electronic display 155, the optics block 165, and an eye cup 255. The eye cup 255 is mechanically secured with the front rigid body 205, and holds the optics block 165. The electronic display 155 emits image light toward the optics block 165. The optics block 165 magnifies the image light, and in some embodiments, also corrects for one or more additional optical errors (e.g., distortion, astigmatism, etc.). The optics block 165 directs the image light to the exit pupil 250 for presentation to the user. In some embodiments, the optics block 165 and the eye cone 255 may be omitted from the optical block 230.

Figure 4A:
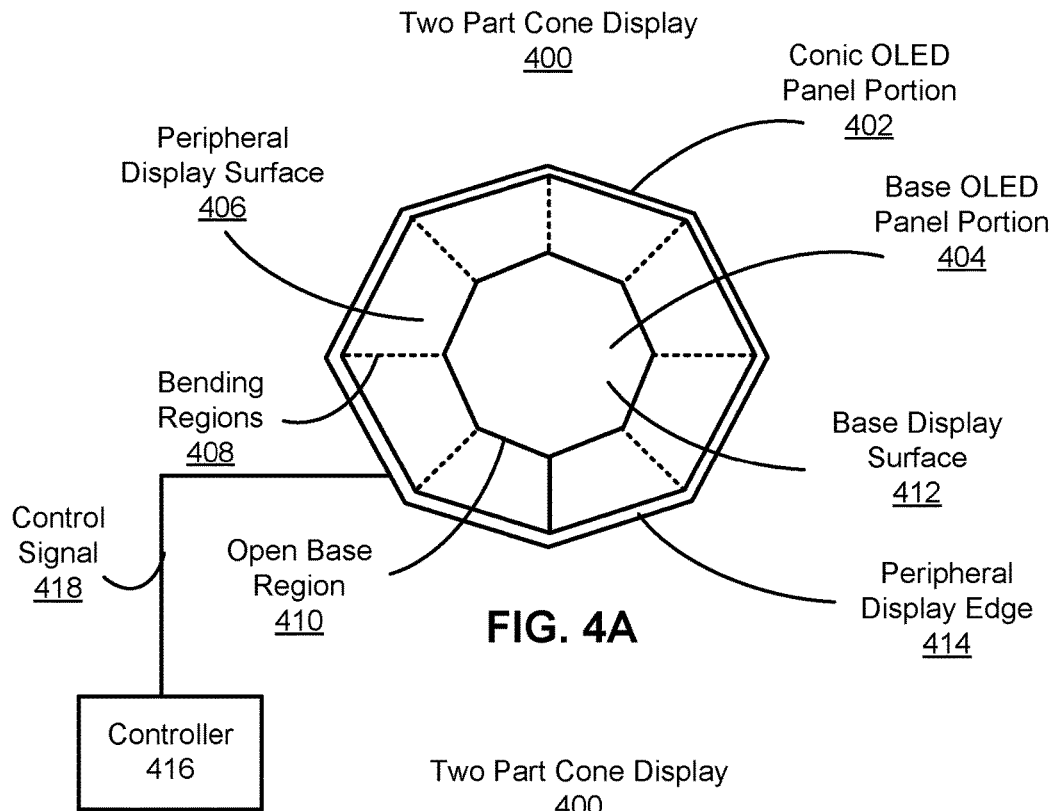
FIGS. 4A and 4B show front and side views of an example two part cone display, in accordance with some embodiments.
Figure 4B:
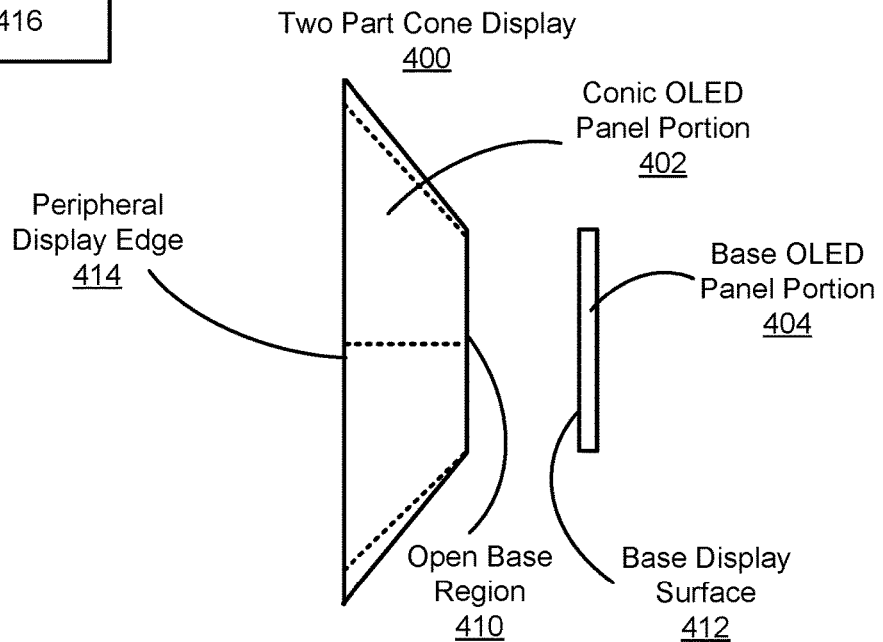

FIGS. 4A and 4B show front and side views, respectively, of a two part cone display 400, in accordance with some embodiments. The two part cone display 400 is an example of an electronic display 155 of the HMD 105 that approximates a circular convex display. As discussed above, the HMD 105 may include two optical blocks 230, one optical block 230 for each of the user's eyes. Each optical block 230 may include a two part cone display 400.

The two part cone display 400 includes a conic OLED panel portion 402, a base OLED panel portion 404, and a controller 416. The conic OLED panel portion 402 has multiple peripheral display surfaces 406 that form a truncated conic shape with an open base region 410 around the center of the conic OLED panel portion 402. In some embodiments, the peripheral display surfaces 406 are flat surfaces separated by bending regions 408. In one embodiment, the conic OLED panel portion 402 is fabricated from a flat OLED panel, and is bent along the bending regions 408 to form the truncated conic shape.

The base OLED panel portion 404 includes a base display surface 412. The base OLED panel portion 404 may be a flat OLED panel that is positioned to cover the open base region 410 of the conic OLED panel portion 402 such that the peripheral display surfaces 406 of the conic OLED panel portion 402 surround the base display surface 412 of the base OLED panel portion 404. Although shown in FIG. 4B as being placed at a distance from the conic OLED panel portion 402, the base OLED panel portion 404 may be placed in close proximity (e.g., directly adjacent) to the open base region 410 to cover the open base region 410. In some embodiments, the base OLED panel portion 404 is larger than the open base region 410 of the conic OLED panel portion 402. The base OLED panel portion 404 is located behind the conic OLED panel portion 402 to cover the open base region 410. The base OLED panel portion 404 may be various shapes, such as a circular shape, rectangular shape, etc. In some embodiments, the base OLED panel portion 404 is shaped and sized smaller to fit within the open base region 410. In still other embodiments, the base OLED panel portion 404 is shaped and sized to match the shape and size of the open base region 410.

The controller 416 provides a control signal 418 that drives the conic OLED panel portion 402 to provide video images on the peripheral display surface 406, and drives the base OLED panel portion 404 to provide video images on the base display surface 412. In some embodiments, the controller 416 is configured to drive the base OLED panel portion 404 at a higher resolution than the conic OLED panel portion 402. Here, the central regions of the two part cone display 400 are driven at a higher resolution than the peripheral regions of the two part cone display 400. In some embodiments, base OLED panel portion 404 is fabricated with a higher pixel density than the conic OLED panel portion 402. In some embodiments, a first controller controls the conic OLED panel portion 402 and a separate second controller controls the base OLED panel portion 404.

Figure 5:
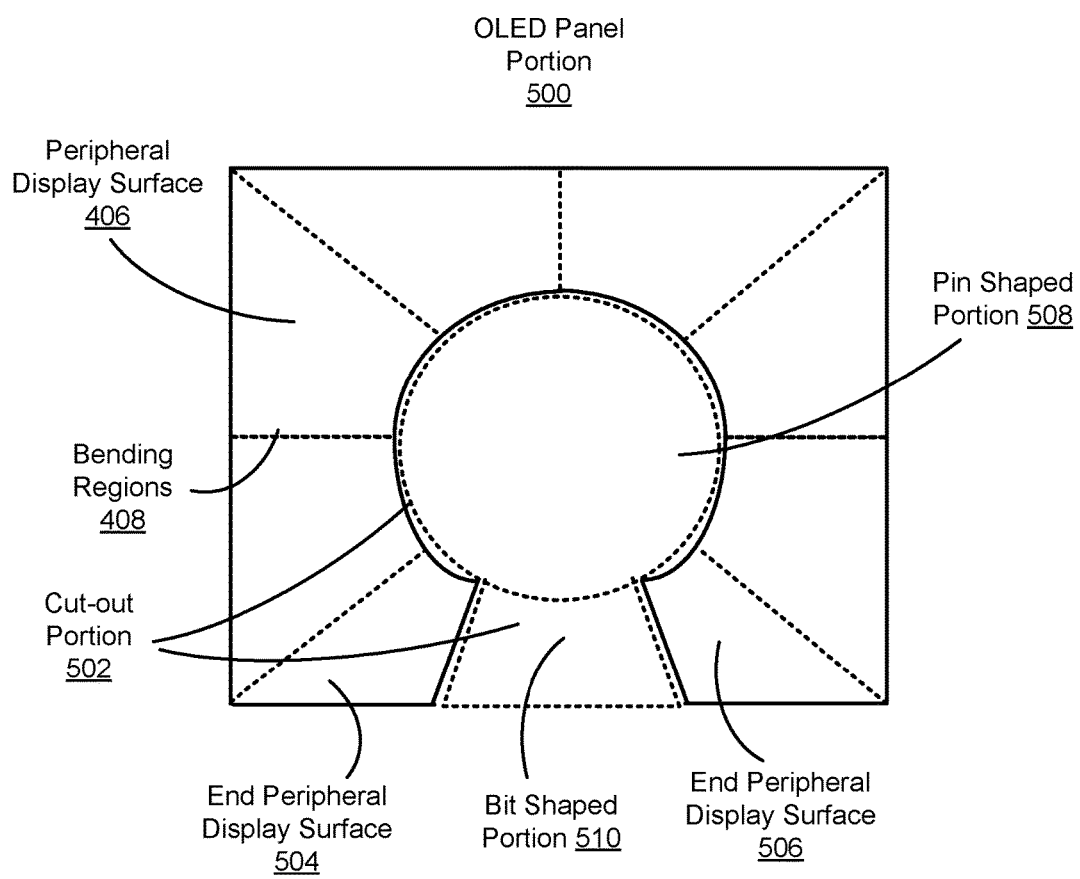
FIG. 5 shows a flexible organic light emitting diode (OLED) panel portion that bends to form a conic OLED panel portion, in accordance with some embodiments.

FIG. 5 shows an OLED panel portion 500 that can be bent to form a conic OLED panel portion 402, in accordance with some embodiments. The OLED panel portion 500 may be manufactured as a flat OLED panel including peripheral display surfaces 406 that are separated by bending regions 408. The OLED panel portion 500 is bent along the bending regions 408 to form the truncated conic shape of the conic OLED panel portion 402.

The peripheral display surfaces 406 define a cut-out portion 502 of the OLED panel portion 500. The cut-out portion 502 may include a keyhole shape having a (e.g., circular) pin shaped portion 508 and a bit shaped portion 510. When the OLED panel portion 500 is bent along the bending regions 408 to form the truncated conic shape, the end peripheral display surfaces 504 and 506 (e.g., display surfaces separated by the bit portion of open base region 410) are joined, and pin shaped portion 508 of the cut-out portion 502 forms the open base region 410. The size of the bit shaped portion 510 can be adjusted to control the orientation of the peripheral display surfaces 406 relative to the base display surface 412 for the conic OLED portion 502, with a larger bit portion resulting in more sloped peripheral display surfaces 406 relative to the flat base display surface 412, and a smaller bit portion resulting in less sloped peripheral display surfaces 406 relative to the flat base display surface 412. When used in a HMD, the slope of the peripheral display surfaces 406 relative to the base display surface 412 may be configured based on the properties of the optics block 165 to compensate for light distortion by the optics block 165 such that the two part conic OLED display provides a substantially flat image to the user's eye. The size of the pin shaped portion 508 of the cut-out portion 502 can be adjusted to control the size of the open base region 410, and thus the relative sizes of the base display surface 412 and the peripheral display surfaces 406. For example, larger pin shaped portions 508 result in larger open base regions 410 and smaller pin shaped portion 508 result in smaller open base regions 410. The size ratio between the base display surface 412 and the peripheral display surfaces 406 may also be configured to compensate for light distortion by the optics block 165. An optimal size ratio may be chosen such that the optics block 165 provides the substantially flat image to the user's eye.

The flat OLED panel portion 500 is shown as having a rectangular shaped profile in FIG. 5 prior to being formed into the conic OLED panel portion 402. The OLED panel portion 500 may be of various other shapes. For example, the OLED panel portion 500 may include a circular shaped profile such that the peripheral display surfaces 406 define a flat peripheral display edge 414 (as shown in FIGS. 4A and 4B) when the OLED panel portion 500 is bent into the truncated conic shape.

Figure 6:
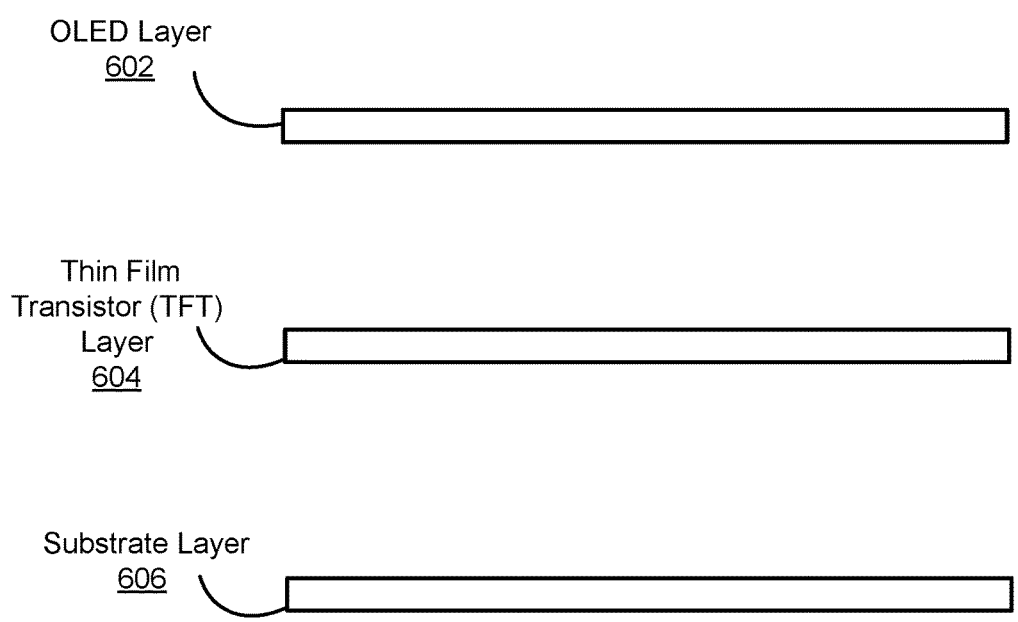
FIG. 6 shows a cross sectional side view of an OLED panel portion, in accordance with some embodiments.

FIG. 6 shows a cross sectional side view of the OLED panel portion 500, in accordance with some embodiments. The OLED panel portion 500 includes flexible layers that support bending. The OLED panel portion 500 includes an OLED layer 602, a thin film transistor (TFT) layer 604, and a substrate layer 606.

The substrate layer 606 is a flexible substrate to support the bending of the OLED panel portion 500. In some embodiments, the substrate layer 606 is a polyethylene terephthalate (PET) layer. The OLED layer 602 and the TFT layer 604 may be fabricated on the substrate layer 606. The OLED layer 602 includes anodes, an organic electroluminescent layer, and cathodes for a plurality of OLED pixels. The cathodes and anodes provide a current through the organic electroluminescent layer that causes light emission from the organic electroluminescent layer. The TFT layer 604 may be connected with the anodes to provide an active matrix of switching and driving transistors for controlling the current flowing to individual pixels.

The TFT layer 604 includes metal trace lines that form a matrix of source and drain electrodes of the TFT layer 604. In some embodiments, the TFT layer 604 has a reinforced structure at the bending regions 408 of the OLED panel portion 500 to protect the OLED panel portion 500 from damage when bent along the bending regions 408. For example, the metal trace lines that cross a bending region 408 may include a winding pattern (e.g., rather than straight metal trace lines) to make the metal trace lines more resistant to bending along the bending regions 408. Alternatively or additionally, the TFT layer 604 may include redundant metal trace lines at the bending regions 408 to make the metal trace lines more resistant to bending at the bending regions 408. In some embodiments, the TFT layer 604 is further reinforced at the bending regions 408 by a cover layer that protects the metal traces from moisture or air. In various embodiments, one or more layers of the OLED panel portion 500 may be reinforced at bending regions 408, such as by incorporating flexible components, redundancy of components, protective materials, etc.

FIG. 7 shows a method 700 of manufacturing a two part cone display, in accordance with some embodiments. Method 700 includes fabricating 710 an OLED panel portion 500 having peripheral display surfaces 406 separated by bending regions 408. Fabricating the OLED panel portion 500 may include fabricating the OLED layer 602 and TFT layer 604 on the flexible substrate layer 606. As discussed above, fabricating the OLED panel portion 500 may further include fabricating bending regions 408, such as by incorporating a reinforced structure for the TFT layer 604 at the bending regions 408 of the OLED panel portion 500.

The OLED panel portion 500 may be fabricated with the cut-out portion 502 and the desired final profile shape (e.g., such that the OLED panel portion 500 can be bent to form the flat peripheral display edge 414). In some embodiments, the OLED panel portion 500 is fabricated as a flat, rectangular OLED panel before being bent along the bending regions 408. The cut-out portion 502, and one or more other portions, of the rectangular OLED panel may be removed to form the desired profile shape.

In some embodiments, fabricating the OLED panel portion 500 includes fabricating one or more first panel drivers to control pixels at a first side of the OLED panel portion 500, and fabricating one or more second panel drivers to control pixels at a second side of the OLED panel portion 500. The one or more first panel drivers are positioned at a first side edge of the OLED panel portion 500. The one or more second panel drivers are positioned at a second side edge of the OLED panel portion opposite the first side edge.

Figure 9:
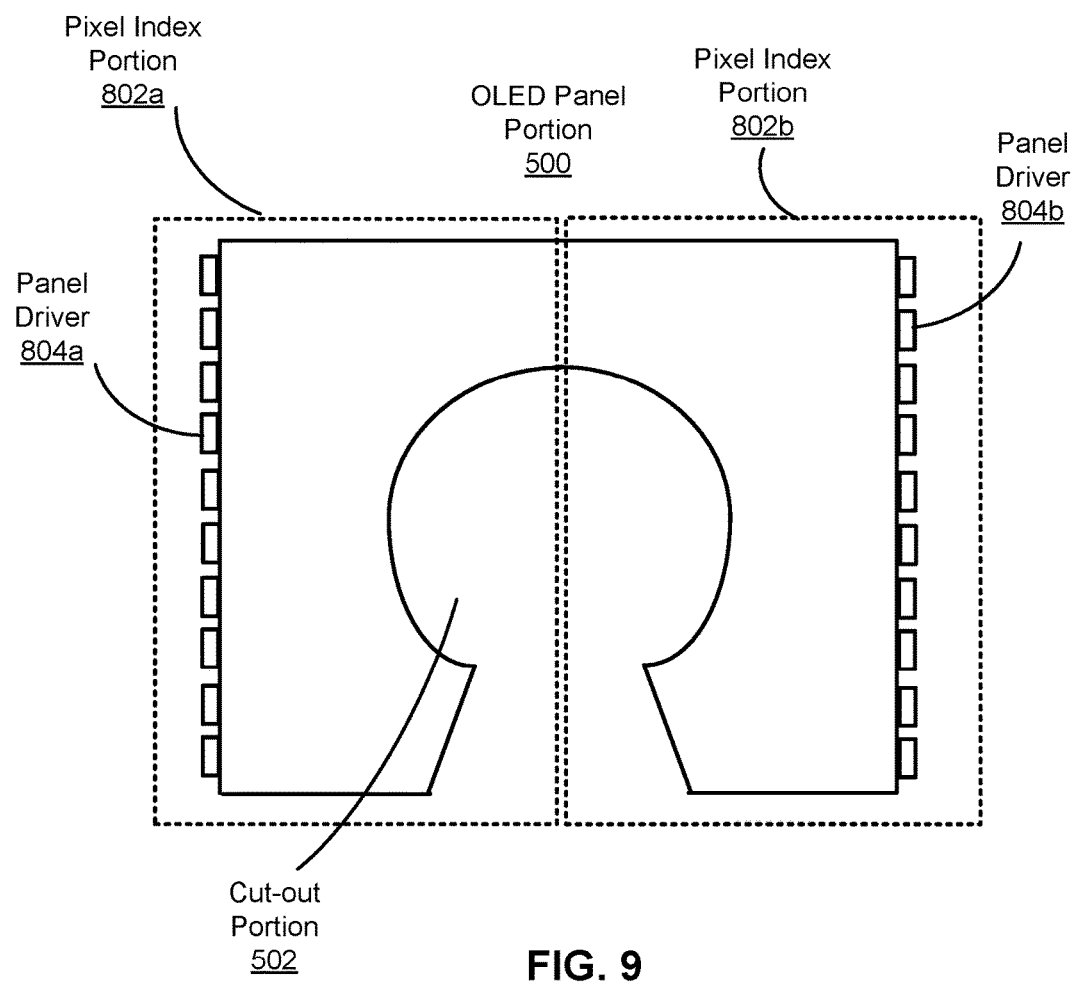
FIG. 9 shows an OLED panel portion including multiple pixel index regions, in accordance with some embodiments.

The OLED panel portion 500 is bent 720 along the bending regions 408 to form the conic OLED panel portion 402. Each bend region 408 defines a bending axis between adjacent peripheral display surfaces 406. The peripheral display surfaces 406 of the conic OLED panel portion 402 form a truncated conic shape with an open base region 410 around a center of the conic OLED panel portion. The end peripheral display surfaces 504 and 506 are joined, and the pin shaped portion 508 of the cut-out portion 502 forms the open base region 410 of the conic OLED panel portion 402. In some embodiments, the conic OLED panel portion 402 is secured to a conic backplane to maintain the truncated conic shape. The backplane includes an open region aligned with the open base region 410 such that the backplane does not cover the open base region 410. The conic backplane may be a printed circuit board (PCB) that connects panel drivers (e.g., as shown in FIG. 9) of the conic OLED panel portion 402 to the controller 416.

The base OLED panel portion 404 is fabricated 730. The base OLED panel portion 404 may include an organic layer 602, TFT layer 604, and substrate layer 606. The base OLED panel portion 404 may be different from the OLED panel portion 500 in that the base OLED portion 404 does not include bending regions, or reinforced structures at the bending regions. The base OLED panel portion 404 may be various shapes, such as a circular shape, rectangular shape, etc. The base OLED panel portion may be larger than the size of the open base region 410 of the conic OLED panel portion 402 such that the base OLED panel portion 404 can cover the open base region 410. In some embodiments, the base OLED panel portion 404 is shaped and sized to cover the open base region 410 by fitting within the open base region 410.

The base OLED panel portion 404 is positioned 740 to cover the open base region 410 of the conic OLED panel portion 402. For example, the base OLED panel portion 404 and the conic OLED panel portion 402 may be mounted within a front rigid body 205 of the HMD 105. The peripheral display surfaces 406 of the conic OLED panel portion 402 surround the base display surface 412 of the base OLED panel portion 404. The peripheral display surfaces 406 and the base display surface 412 collectively form the display surfaces of an electronic display 155. The base display surface 412 includes pixels for the center region of the electronic display 155, and the peripheral display surfaces 406 include pixels for the peripheral side edges of the electronic display 155.

Figure 8A:
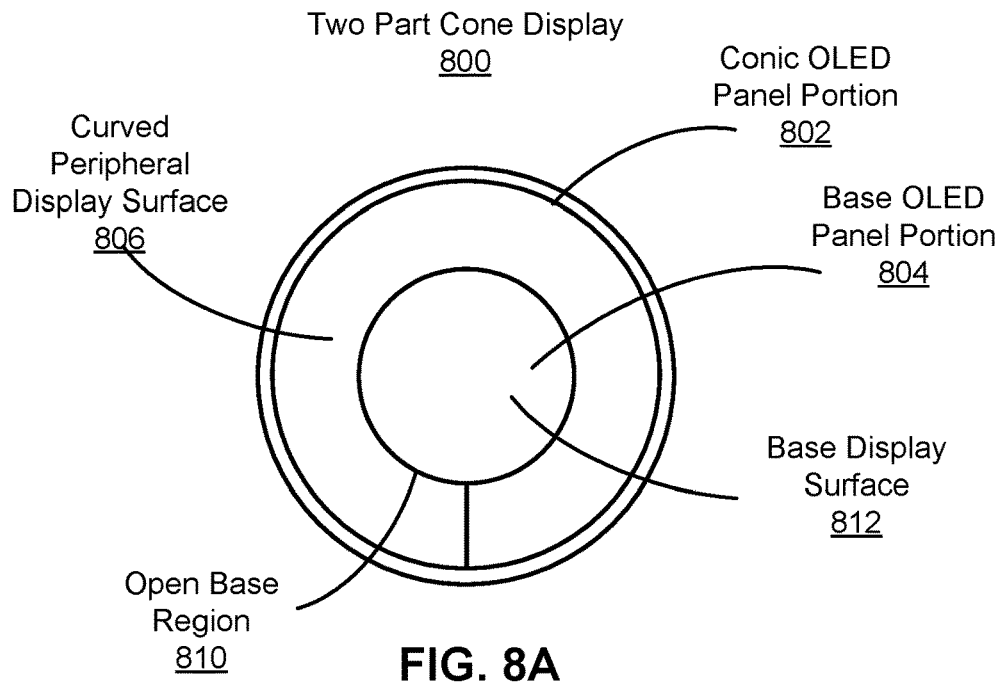
FIGS. 8A and 8B show front and side views of a two part cone display including curved peripheral display regions, in accordance with some embodiments.
Figure 8B:
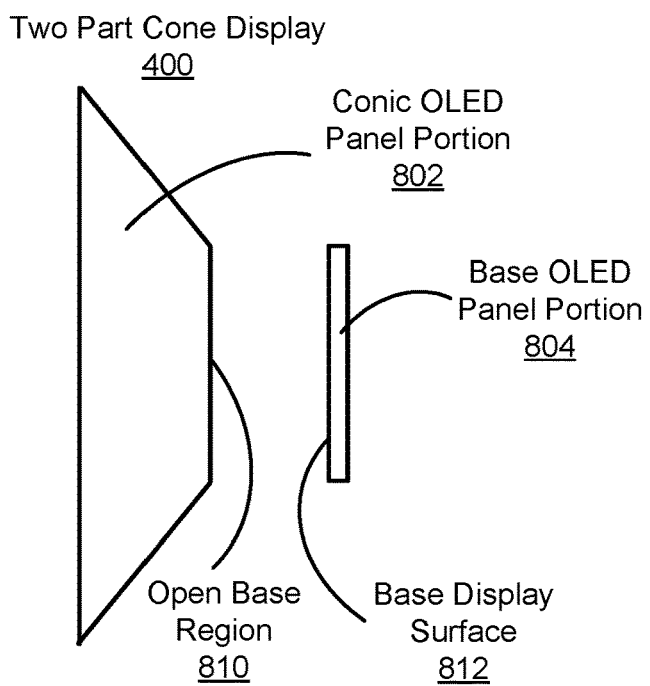

FIGS. 8A and 8B show front and side views of a two part cone display 800, in accordance with some embodiments. The two part cone display 800 is an example of an electronic display 155 of the HMD 105. The two part cone display 800 includes a conic OLED panel portion 802 including a curved peripheral display surface 806. In the embodiment of FIGS. 8A and 8B, the conic OLED panel portion 802 does not include any sharp bending regions, or flat peripheral display surfaces between bending regions, but is rather curved smoothly throughout the entire peripheral display surface 806. The curved peripheral display surface 806 forms a truncated conic shape including an open base region 810. A base OLED panel portion 804 is positioned to cover the open base region 810 of the conic OLED panel portion 802 such that the curved peripheral display surface 806 of the conic OLED panel portion 802 surround the base display surface 812 of the base OLED panel portion 804. The conic OLED panel portion 802 may be created in a manner similar to the conic OLED panel portion 402, such as by curving a flat OLED panel portion including a cut-out portion, and joining the ends of the curved peripheral display surface 806.

FIG. 9 shows an OLED panel portion 500 including multiple pixel index regions, in accordance with some embodiments. The OLED panel portion 500 includes a first pixel index portion 802a and a second pixel index portion 804b that divides the OLED panel portion 500 into two (e.g., symmetrical) half portions. The half portions may divide the OLED panel portion 500 by opposing sides of the cut-out portion 502. The pixels associated with the pixel index portion 802a are controlled by one or more panel drivers 804a, and the pixels associated with the pixel index portion 804b controlled by one or more panel drivers 804b. The panel drivers 804a and 804b may be integrated circuits connected with the controller 416 to receive the control signal 418. In some embodiments, the panel drivers 804a and 804b are positioned on opposing sides of the OLED panel portion 500 to address all pixels of the OLED panel portion 500. In some embodiments, the panel drivers may have a chip on flex (COF) configuration, and may be placed on flat and rectangular regions of the OLED panel portion 500. For example, flexible printed circuits (FPC) could be placed along a non-emitting side of the OLED panel portion 500.

In some embodiments, a conic PCB backplane connects the panel drivers 804a and 804b to the controller 416, and may also provide structural support to maintain the conic OLED panel portion in the truncated conic shape. In some embodiments, a bezel provides structural support for the conic OLED panel portion. The bezel can be arranged along the peripheral display edge, or placed at the base of the cone (i.e., the edge of the field of view in the system), or on portions of the OLED panel portion that are overlapped by other portions. Reinforcement of the conic OLED panel portion may be achieved by mating the formed display to a solid piece, such as one made by injection molding.

Additional Configuration Information

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method of manufacturing an organic light emitting diode (OLED) display, comprising:
    fabricating an OLED panel portion having peripheral display surfaces, adjacent peripheral display surfaces being connected by bending regions;
    bending the OLED panel portion along the bending regions to form a conic OLED panel portion, the peripheral display surfaces of the conic OLED panel portion forming a truncated conic shape with an open base region around a center of the conic OLED panel portion;
    fabricating a base OLED panel portion having a base display surface, the base OLED panel portion being separate from the OLED panel portion; and
    positioning the base OLED panel portion to cover the open base region of the conic OLED panel portion such that the peripheral display surfaces surround the base display surface.

2. The method of claim 1, wherein the OLED panel portion is flat prior to being bended along the bending regions to form the conic OLED panel portion.

3. The method of claim 1, wherein the peripheral display surfaces of the OLED panel portion define a cut-out portion, the cut-out portion forming the open base region of the conic OLED panel portion when the OLED panel portion is bent along the bending regions.

4. The method of claim 3, wherein:
    peripheral display surfaces include at least a first end peripheral display surface and a second end peripheral display surface; and
    the method further includes joining the first end peripheral display surface with the second end peripheral display surface such that the peripheral display surfaces form the truncated conic shape.

5. The method of claim 1, wherein the peripheral display surfaces of the conic OLED panel portion are flat, and the base display surface is flat.

6. The method of claim 1, further comprising fabricating one or more first panel drivers to control pixels at a first side of the OLED panel portion and one or more second panel drivers to control pixels at a second side of the OLED panel portion, the one or more first panel drivers positioned at a first side edge of the OLED panel portion, the one or more second panel drivers positioned at a second side edge of the OLED panel portion opposite the first side edge.

7. The method of claim 1, wherein each of the bending regions defines a bending axis between adjacent peripheral display surfaces of the conic OLED panel portion.

8. An organic light emitting diode (OLED) display, comprising:
a conic OLED panel portion having peripheral display surfaces connected by bending regions, the conic OLED panel portion being bent at the bending regions such that the peripheral display surfaces form a truncated conic shape with an open base region around a center of the conic OLED panel portion; and
a base OLED panel portion having a base display surface, the base OLED panel portion being separate from the conic OLED panel portion, the base OLED panel portion positioned to cover the open base region of the conic OLED panel portion such that the peripheral display surfaces surround the base display surface.

9. The OLED device of claim 8, wherein the peripheral display surfaces are flat and the base display surface is flat.

10. The OLED device of claim 8, wherein the conic OLED panel portion includes one or more first panel drivers to control pixels at a first side of the conic OLED panel portion and one or more second panel drivers to control pixels at a second side of the conic OLED panel portion, the one or more first panel drivers positioned at a first side edge of a OLED panel portion that is bent to form the conic OLED panel portion, the one or more second panel drivers positioned at a second side edge of the OLED panel portion opposite the first side edge.

11. The OLED device of claim 8, wherein the peripheral display surfaces of the conic OLED panel portion include at least a first end peripheral display surface joined with a second end peripheral display surface such that the peripheral display surfaces form the truncated conic shape.

12. The OLED device of claim 8, further including a controller configured to drive the base OLED panel portion at a higher resolution than the conic OLED panel portion.

13. The OLED device of claim 8, wherein each of the bending regions defines a bending axis between adjacent peripheral display surfaces of the conic OLED display portion.

14. The OLED device of claim 8, further including a controller configured to drive the base OLED panel portion at a higher resolution than the conic OLED panel portion.

15. A head-mounted display, comprising:
a left two part cone organic light emitting diode (OLED) display and a right two part cone OLED display, each OLED display including:
a conic OLED panel portion having peripheral display surfaces connected by bending regions, the conic OLED panel portion being bent at the bending regions such that the peripheral display surfaces form a truncated conic shape with an open base region around a center of the conic OLED panel portion; and
a base OLED panel portion having a base display surface, the base OLED panel portion being separate from the conic OLED panel portion, the base OLED panel portion positioned to cover the open base region of the conic OLED panel portion such that the peripheral display surfaces surround the base display surface.

16. The HMD of claim 15, wherein the peripheral display surfaces of the conic OLED panel portion include at least a first end peripheral display surface joined with a second end peripheral display surface such that the peripheral display surfaces form the truncated conic shape.

17. The HMD of claim 15, further including a controller configured to drive the base OLED panel portion at a higher resolution than the conic OLED panel portion.

18. The HMD of claim 15, wherein each of the bending regions defines a bending axis between adjacent peripheral display surfaces of the conic OLED display portion.

19. The HMD of claim 15, wherein the conic OLED panel portion includes one or more first panel drivers to control pixels at a first side of the conic OLED panel portion and one or more second panel drivers to control pixels at a second side of the conic OLED panel portion, the one or more first panel drivers positioned at a first side edge of an OLED panel portion that is bent to form the conic OLED panel portion, the one or more second panel drivers positioned at a second side edge of the OLED panel portion opposite the first side edge.

20. The HMD of claim 15, further comprising:
a left optics block positioned in front of the left two part cone OLED display to direct light emitted from the left two part cone OLED display; and
a right optics block is positioned in front of the right two part cone OLED display to direct light emitted from the right two part cone OLED display.

* * * * *